(12) United States Patent  (10) Patent No.: US 7,173,420 B2
Tamura  (45) Date of Patent: Feb. 6, 2007

(54) MAGNETIC DETECTION DEVICE AND METHOD FOR MANUFACTURE

(75) Inventor: Yasuhiro Tamura, Tokyo (JP)

(73) Assignee: C & N Inc., Tokyo (JP)

( * ) Notice: Subject to any disclaimer, the term of this patent is extended or adjusted under 35 U.S.C. 154(b) by 0 days.

(21) Appl. No.: 11/067,209

(22) Filed: Feb. 28, 2005

(65) Prior Publication Data

US 2006/0012364 A1  Jan. 19, 2006

Related U.S. Application Data

(63) Continuation of application No. PCT/JP04/10227, filed on Jul. 16, 2004.

(51) Int. Cl.
*G01R 33/02*  (2006.01)

(52) U.S. Cl. ............. 324/247; 324/260; 324/249; 33/352

(58) Field of Classification Search ......... 324/246, 324/247, 244, 260, 249; 33/310, 352, 355 R; 702/150
See application file for complete search history.

(56) References Cited

U.S. PATENT DOCUMENTS

| | | | | |
|---|---|---|---|---|
| 4,656,750 | A * | 4/1987 | Pitt et al. ............... | 33/352 |
| 5,433,110 | A * | 7/1995 | Gertz et al. .......... | 73/514.35 |
| 5,644,230 | A * | 7/1997 | Pant et al. ............ | 324/247 |
| 6,504,366 | B2 * | 1/2003 | Bodin et al. ......... | 324/247 |
| 2005/0122100 | A1 * | 6/2005 | Wan et al. ........... | 324/247 |

FOREIGN PATENT DOCUMENTS

| | | | |
|---|---|---|---|
| JP | 58-139081 | * | 8/1983 |
| JP | HEI 1-250084 | | 10/1989 |
| JP | HEI 2-111085 | | 4/1990 |
| JP | HEI 11-038109 | | 2/1999 |
| JP | 2004-165333 | | 6/2004 |

OTHER PUBLICATIONS

English Abstract of JP Application, HEI 09-209740, Publication No. 11-038109, Feb. 12, 1999, Patent Abstracts of Japan, Japanese Patent Office Website.
English Abstract of JP Application, HEI 63-265007, Publication No. 02-111085, Apr. 24, 1990, Patent Abstracts of Japan, Japanese Patent Office Website.
English Abstract of JP Application, HEI 63-272755, Publication No. 01-250084, Oct. 5, 1989, Patent Abstracts of Japan, Japanese Patent Office Website.
English Abstract of JP Application, HEI 2002-327957, Publication No. 2004-165333, Jun. 10, 2004, Patent Abstracts of Japan, Japanese Patent Office Website.

* cited by examiner

*Primary Examiner*—Jay M. Patidar

(57) ABSTRACT

A magnetic sensor assembly comprising magnetic detection elements is provided. In a magnetic sensor assembly 100 according to the present invention, a magnetic detection element 140 is fixed to a base member 110 and, by having the base member 110 stand upright, it is possible to stand the magnetic detection element 140 upright. Thereby, it becomes easy to manufacture magnetic detection devices which detect three-axis components of terrestrial magnetism vector. In the base member 110, first terminals 120 are provided on a first surface 112 whereas second terminals 124 are provided on a second surface 114. The first terminals 120 are electrically connected with electrodes of the magnetic detection element 140 whereas the second terminals 124 are electrically connected to external wires.

6 Claims, 7 Drawing Sheets

MAGNETIC DETECTION DEVICE AND METHOD FOR MANUFACTURE

CROSS REFERENCE TO RELATED APPLICATION

This application is a continuation of PCT/JP04/10227 which was filed on Jul. 16, 2004 by Yasuhiro TAMtJPA and entitled MAGNETIC SENSOR ASSEMBLY, TERRESTRIAL MAGNETIC DETECTION DEVICE, ELEMENT ASSEMBLY AND MOBILE TEBJYTINAL APPARATUS.

FIELD OF THE INVENTION

The present invention relates to an assembly comprising an element and a base member, and particularly relates to an assembly including at least one magnetic detection element.

BACKGROUND

In recent years, the use of mobile terminal apparatuses, such as cellular phones or PDAs (Personal Digital Assistances), has been spreading explosively, and there have been active movements to add a variety of functions to such mobile terminal apparatuses in order to expand their uses. Conventionally, voice communications were the main purpose for cellular phones, but today there are even types that allow the downloading of map information and displaying the present position on the map.

A mobile terminal apparatus, with a GPS (Global Positioning System) function built into it, can display on the screen a present position on map information downloaded. To increase the convenience of a mobile terminal apparatus, it is preferable that a navigation function to a destination be further realized. To accomplish it, it is necessary to provide thereon an azimuth sensor that measures the direction from present position to destination. Azimuthal information from the azimuth sensor, if it can be obtained, can complement the positional information based on GPS information, thereby enabling a screen display and voice guidance of the route to the destination.

A magnetic detection device is used for the measurement of azimuth. A magnetic detection device detects not only natural magnetic fields but also dynamic magnetic fields generated by the internal structure of the mobile terminal apparatus as well as by nearby electrical equipment or the like. Hence, in order to extract the natural magnetic field component only, it is necessary to delete the dynamic magnetic components from the magnetic components detected. When a two-axis magnetic detection device is used, the magnetic field strength cannot be determined, so that it is difficult to remove the dynamic magnetic components efficiently. Under these circumstances, consideration is now being given to the introduction of a three-axis magnetic detection device in order to determine the magnetic field strength.

In order to detect each of the three-axis components of terrestrial magnetism vector, it is necessary that a magnetic detection device be provided with at least three magnetic detection elements. In particular, since a mobile terminal apparatus is subject to spatial limitations, it is a mandatory requirement to employ a smaller size for a three-axis magnetic detection device when it is introduced into the mobile terminal apparatus.

SUMMARY OF THE INVENTION

An object of the present invention is therefore to provide a novel technology for equipping a magnetic detection device with a plurality of magnetic detection elements.

In order to achieve the above object, a mode of the present invention relates to a magnetic sensor assembly comprising a magnetic detection element having electrodes and a base member on which the magnetic detection element is fixed. In a magnetic sensor assembly according to this mode, the base member has a first surface which is substantially parallel to a surface of the magnetic detection element and a second surface which is disposed at a predetermined angle to the first surface, there are provided a first terminal and a second terminal, which are electrically connected, on the first surface and the second surface, respectively, and the electrode provided in the magnetic detection element is electrically connected with the first terminal. With this structure of a magnetic sensor assembly, the magnetic detection element can be easily connected electrically with the first terminal and at the same time, by having the magnetic sensor assembly stand upright on a substrate, the magnetic detection element can stand upright on the substrate.

The electrode may be provided on the surface of the magnetic detection element, and the electrode may be connected with the first terminal by bonding wire. The bonding wire is formed by utilizing a wire bonding process. Also, the electrode may be provided on a rear face of the magnetic detection element, and the electrode is connected with the first terminal by utilizing a wireless bonding process. Here, the rear face is a back side disposed counter to the surface, and is the side with which the base member is fixed. The first surface of the base member may be angled substantially perpendicular to the second surface thereof.

Another mode of the present invention relates to a terrestrial magnetic detection device in which a plurality of magnetic detection elements each of which detects a terrestrial magnetism vector are provided on a substrate. In a terrestrial magnetic detection device according to this mode, at least one magnetic detection element is fixed to a base member and structured as a magnetic sensor assembly together with the base member. As explained above as the first mode of the present invention, in this magnetic sensor assembly the base member has a first surface which is substantially parallel to a surface of the magnetic detection element and a second surface which is disposed at a predetermined angle to the first surface, there are provided a first terminal and a second terminal, which are electrically connected, on the first surface and the second surface, respectively, and the electrode provided in the magnetic detection element is electrically connected to the first terminal. The use of a magnetic sensor, such as a Hall element or MR element, enables to make the magnetic detection device equipped with a magnetic sensor assembly small. The magnetic sensor assembly is fixed so that the second surface thereof is substantially parallel to the substrate. Thereby, it becomes easy to realize connecting the second terminal provided on the second surface to an external circuit formed on the substrate.

Still another mode of the present invention relates to an element assembly comprising an element having electrodes and a base member on which the element is fixed. In an element assembly according to this mode, the base member has a first surface which is substantially parallel to a surface of the element and a second surface which is disposed at a predetermined angle to the first surface, there are provided a first terminal and a second terminal, which are electrically connected, on the first surface and the second surface, respectively, and the electrode provided in the element is electrically connected to the first terminal. Here, the element includes a sensor such as magnetic detection element or electric parts such as LSIs.

It is to be noted that a mobile terminal apparatus equipped with the above-described magnetic sensor assembly, terrestrial magnetic detection device or element assembly constitutes a mode of the present invention.

DETAILED DESCRIPTION

Figure 1:
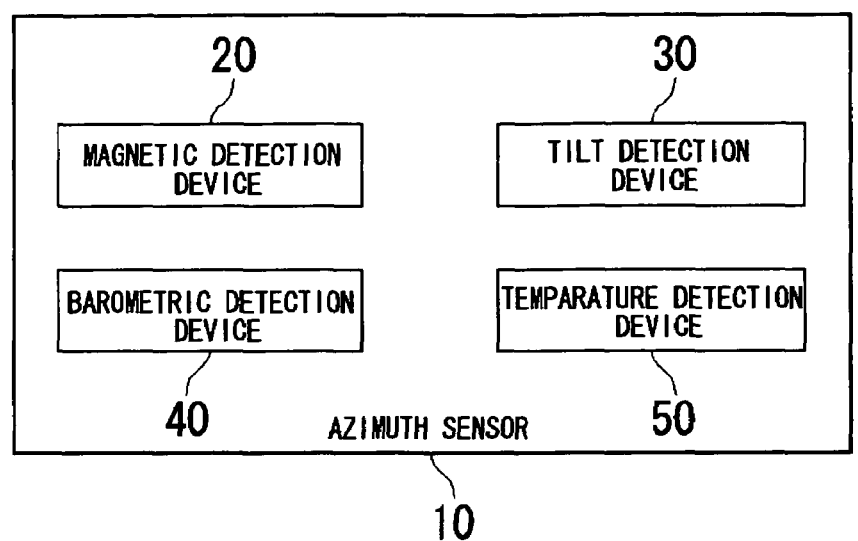
FIG. 1 is a figure showing a structure of an azimuth sensor according to an embodiment.

FIG. 1 is a figure showing a structure of an azimuth sensor 10 according to an embodiment of the present invention. The azimuth sensor 10, equipped with a magnetic detection device 20, a tilt detection device 30, a barometric detection device 40 and a temperature detection device 50, has a function of detecting position, azimuth, height and the like. The azimuth sensor 10 is mounted on a mobile terminal apparatus. For an azimuth sensor 10, a magnetic detection device 20, a tilt detection device 30, a barometric detection device 40 and a temperature detection device 50 may be formed separately from one another, but it is preferable that they be structured on a single substrate and thereby be of small size in order for them to be incorporated into a mobile terminal apparatus. The magnetic detection device 20 has at least three magnetic detection elements that detect the XYZ, or three-axis, components of terrestrial magnetism vector, respectively. The tilt detection device 30 has a function of detecting the tilt angle of the substrate and is preferably capable of detecting the tilt angles in the XYZ, or three-axis, directions. The barometric detection device 40 detects the pressure of the atmosphere. The temperature detection device 50 detects the temperature. The temperature detected is used to correct the deviation of the output of the magnetic detection device 20 due to temperature drift.

Figure 2:
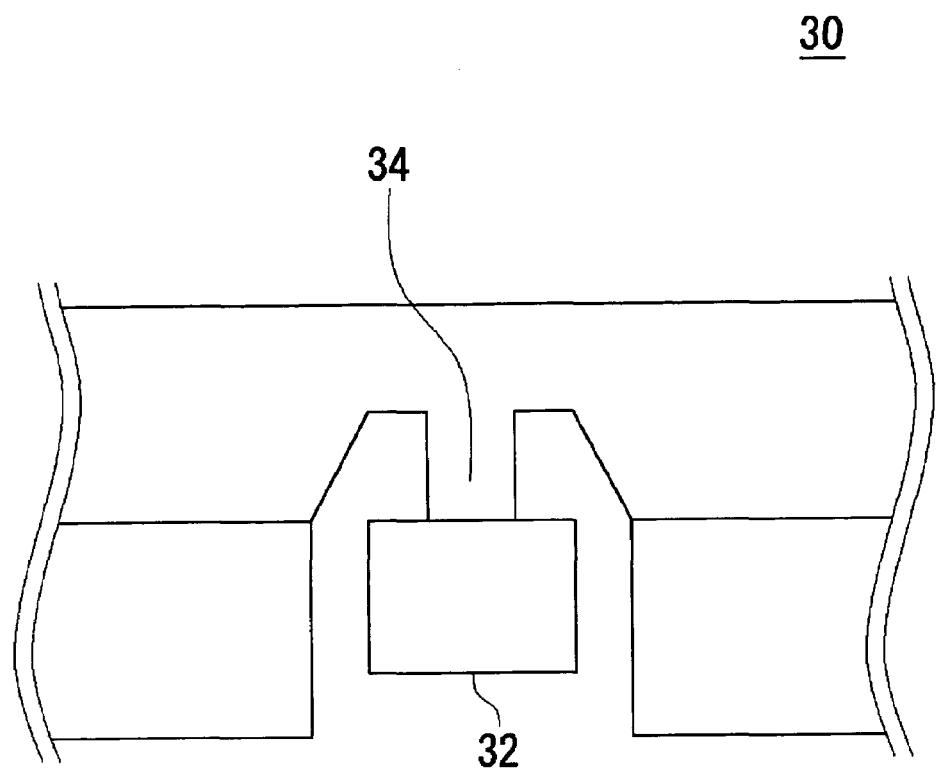
FIG. 2 is a figure showing an example of a tilt detection device.

FIG. 2 is a figure showing an example of a tilt detection device 30. The tilt detection device 30 detects the tilt angles in the XYZ, or three-axis, directions. The tilt detection device 30 has a plumb body 32. As an acceleration component works on this plumb body 32, a distortion is caused in a support member 34 that supports the plumb body 32, and this distortion is detected by a resistive element to measure the tilt. Although only one support member 34 is shown in the figure, the plumb body 32 is supported by a plurality of support members 34 from the XYZ, or three-axis, directions. Preferably, these support members 34 may be so structured as to include a piezo element.

Figure 3:
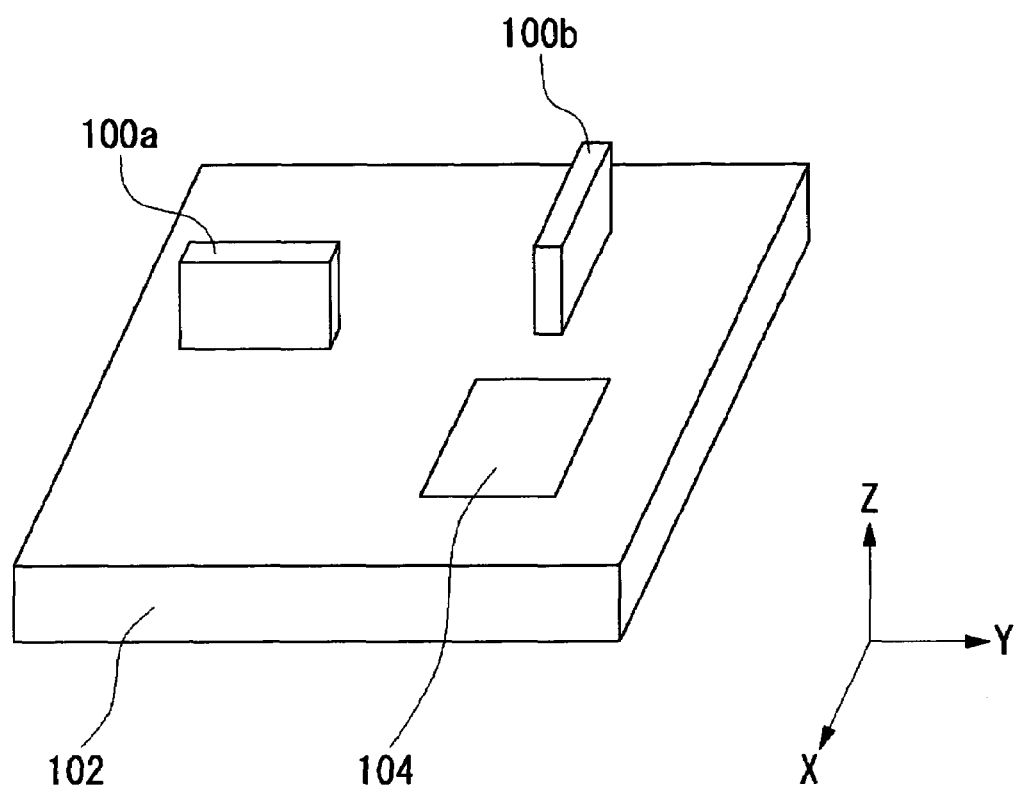
FIG. 3 is a figure showing an example of a magnetic detection device.

FIG. 3 is a figure showing an example of a magnetic detection device 20. The magnetic detection device 20, which functions as a three-axis magnetic sensor, is comprised of a first magnetic sensor assembly 100a which has a first magnetic detection element for detecting the magnetic component in the X-axis direction, a second magnetic sensor assembly 100b which has a second magnetic detection element for detecting the magnetic component in the Y-axis direction, and a third magnetic detection element 104 which detects the magnetic component in the Z-axis direction. Hereinbelow, magnetic sensor assemblies 100a and 100b, when named generically, are called "magnetic sensor assembly 100".

It is to be noted that when the magnetic detection device 20 is tilting at the detection of a terrestrial magnetic component thereby, it is necessary to correct the tilt component thereof by the output value of a tilt detection device 30. When a two-axis tilt detection device (acceleration sensor) is utilized, however, the correction data in the X-axis and Y-axis only can be obtained, so that the tilt of the tilt detection device 30 itself cannot be detected. Accordingly, when a two-axis tilt detection device is used, it has been necessary to correct the detection value of the magnetic sensor by performing a calibration with the Z-axis component of the tilt detection device set to 0, namely, with the tilt detection device held horizontal.

Since a tilt detection device 30 according to an embodiment of the present invention can detect the tilt angles in the three-axis directions, it does not require the calibration with the tilt detection device held horizontal. Also, the use of a plumb body 32 makes it possible to compactly form the tilt detection device 30 on a single substrate together with a magnetic detection device 20 and the like. Because of this tilt detection device 30, an automatic calibration of tilt angle by arithmetic processing of CPU (not shown) can be realized without user's being conscious thereof, thus making it possible to obtain an extremely high-accuracy output of a magnetic detection device 20.

The magnetic sensor assembly 100 is a structure that can be mounted upright on a substrate 102. It is to be noted that since a third magnetic detection element 104 which detects the magnetic component in the Z-axis direction, as in a magnetic detection device 20 of FIG. 3, is not set upright, it is not necessary to form it as the magnetic sensor assembly 100, but it is possible to form it as the magnetic sensor assemblies 100.

While it is known that a magnetosensitive element, such as the Hall element, or a magnetoresistive effect element, such as the MR element, can be formed smaller than a flux gate type magnetic sensor, it has conventionally not been easy to successfully form an MR element or a Hall element on a substrate 102 at a level with which to be incorporated into a mobile terminal apparatus. Hence, an embodiment of the present invention provides a technology for forming a magnetic detection device 20 in small size and, in particular, a technology for forming this magnetic detection device 20 on a single substrate together with other sensors such as a tilt detection device 30.

In a magnetic detection device 20, at least a magnetic detection element to be incorporated into the magnetic sensor assembly 100 is preferably a Hall element or an MR element, and moreover a third magnetic detection element 104 is preferably a Hall element or an MR element also. By forming all the magnetic detection elements using Hall elements or MR elements, it becomes possible to form the magnetic detection device 20 small by a series of semiconductor manufacturing processes. It is necessary to put the Hall elements in a standing position on the substrate 102 so that they can detect the magnetic vectors in the X-axis and Y-axis directions, and it is necessary to put the MR element in a standing position on the substrate 102 so that it can detect the magnetic vector in the Z-axis direction. In FIG. 3, the magnetic detection elements are Hall elements, and the first magnetic detection element and the second magnetic detection element are incorporated in an upright state in the first magnetic sensor assembly 100a and the second magnetic sensor assembly 100b, respectively.

The first magnetic detection element and the second magnetic detection element are disposed at a predetermined angle to the surface of the substrate 102 and detect the two-axis components of magnetic vector in the directions (X-axis direction and Y-axis direction) parallel with the substrate surface, respectively. The first magnetic detection element and the second magnetic detection element are so formed as to stand nearly upright on the surface of the substrate 102. It is preferable that on the surface of the substrate 102 the first magnetic detection element and the second magnetic detection element be disposed such that the perpendiculars of the respective detection surfaces are at an angle of 90 degrees. The third magnetic detection element 104 is formed on the surface of the substrate 102 and detects the magnetic component in the direction (Z-axis direction) perpendicular to the substrate surface.

Figure 4:
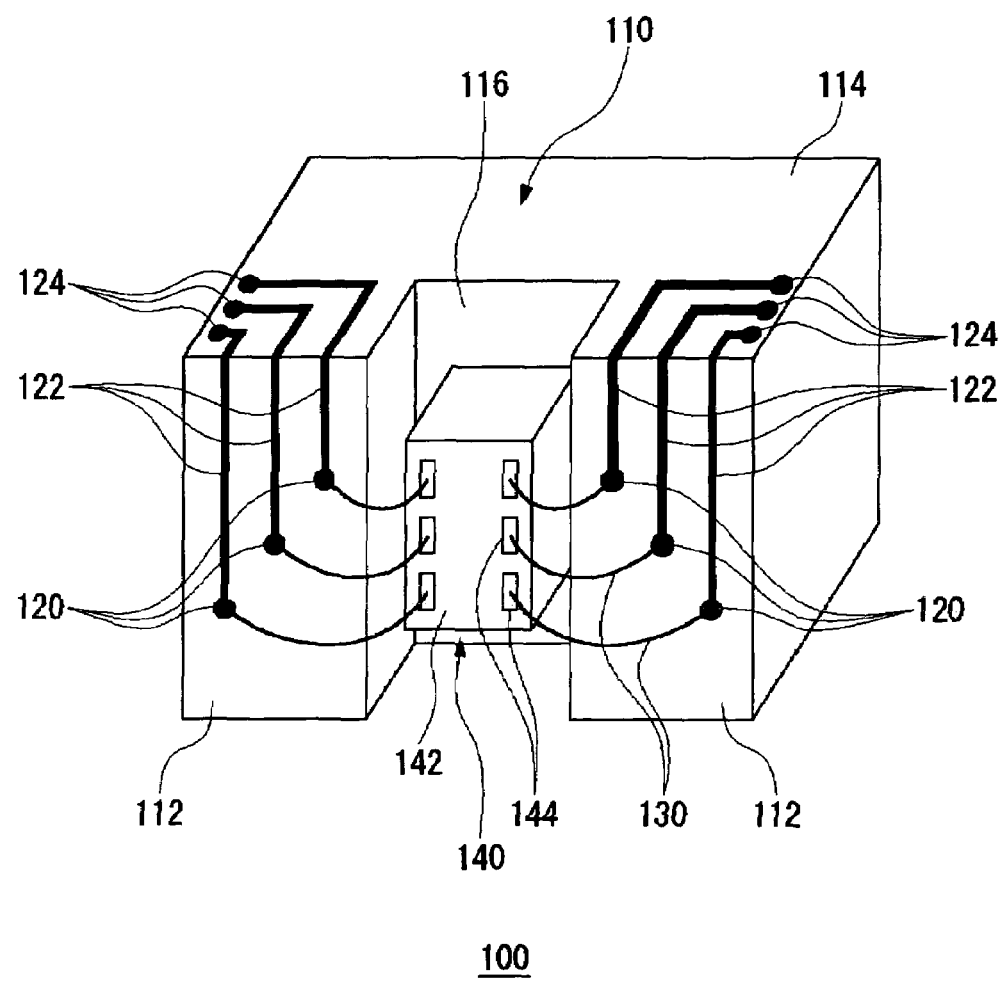
FIG. 4 is a figure showing a structure of a magnetic sensor assembly.

FIG. 4 shows a structure of a magnetic sensor assembly 100. The magnetic sensor assembly 100 is comprised of a base member 110 and a magnetic detection element 140. The magnetic detection element 140 is fixed to the base member 110. The magnetic detection element 140 may have a structure identical or similar to that of the third magnetic detection element 104 shown in FIG. 3. It is to be noted that the magnetic detection element 140 as illustrated is in an upright state and, by fixing the bottom of the base member 110 in this position to a substrate 102, it is possible to stand the magnetic detection element 140 upright on the substrate 102. It is not easy to connect the magnetic detection element 140, standing upright alone on the substrate 102, to an external circuit, but having the base member 110, with the magnetic detection element 140 fixed thereto, stand upright on the substrate 102 makes it easy to connect the base member 110 to an external circuit.

The magnetic detection element 140 has a plurality of electrodes 144 on a surface 142. Here, the surface 142 is a surface on a side disposed counter to the surface to which the base member 110 is fixed. The base member 110 has a plurality of first terminals 120 on a first surface 112 and a plurality of second terminals 124 on a second surface 114. The first terminals 120 and the second terminals 124 are electrically connected with each other, respectively, via wires 122. The wires 122 may be formed on the first surface 112 and second surface 114, or may be formed inside the base surface 110. The second surface 114 is a surface provided at a predetermined angle to the first surface 112. As illustrated, the first surface 112 and second surface 114 may be substantially angled perpendicular to each other. The first surface 112 and second surface 114 are to be so configured as to be different surfaces, and it is not necessary for them to be continuous with each other.

The base member 110 has a groove, whose cross section is formed in a concave shape. The magnetic detection element 140, at the back opposite to the surface 142, is fixed to a third surface 116 of the groove in the base member 110. In fixing the magnetic detection element 140 to the groove in the base member 110, it is preferable that the surface 142 of the magnetic detection element 140 be substantially of the same height as that of the first surface 112 of the base member 110.

The electrodes 144 on the magnetic detection element 140 and the first terminals 120 on the first surface 112 of the base member 110 are connected with each other by wire bonding. The bonding process can be made easy by arranging the surface 142 of the magnetic detection element 140 to be substantially of the same height as that of the first surface 112 of the base member 110. In the bonding process, bonding is done under a constant pressuring at high temperature while rubbing gold wire against the electrodes and terminals. Accordingly, the bonding cannot be carried out with the base member 110 in an upright state as shown in FIG. 4; for a bonding process, therefore, the base member 110 is set on the bonding equipment with the first surface 112 up. By the wire bonding process, the electrodes 144 and the first terminals 120 are electrically connected via gold thin wires 130. As a result, the electrodes 144 are connected to the second terminals 124 by way of the gold thin wires 130 and the wires 122.

On the other hand, if the magnetic sensor assembly 100 is installed upright on the substrate 102 as shown in FIG. 4, then the second surface 114 of the base member 110 will come to the top. Accordingly, for instance, in order for the terminals on the base member 110 to be connected by wire bonding to an external wiring provided on the substrate 102, the terminals must be provided on the second surface 114, which is the top surface. For the above reason, the base member 110 according to an embodiment of the present invention has the second terminals 124, which are formed in an electrode pad for external connection, on the second surface 114. Thus, as has already been described, the first surface 112 and the second surface 114 need to be so angled to each other as to be different surfaces, thereby realizing respective bonding processes for the first terminals 120 and the second terminals 124.

FIG. 5 are figures to explain a process for manufacturing a magnetic sensor assembly.

Figure 5A:
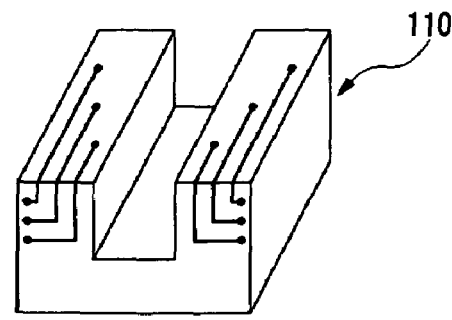
FIG. 5 are figures to explain a process for manufacturing a magnetic sensor assembly.

FIG. 5(a) shows a base member 110. The base member 110 is produced in such a manner that the resin material which has been melted with heat is injected inside a mold, then cooled and solidified to carry out injection molding. After a mold has been formed, terminals 120 and 124 and wires 122 are formed with a conductive material so as to finish the base member 110.

Figure 5B:
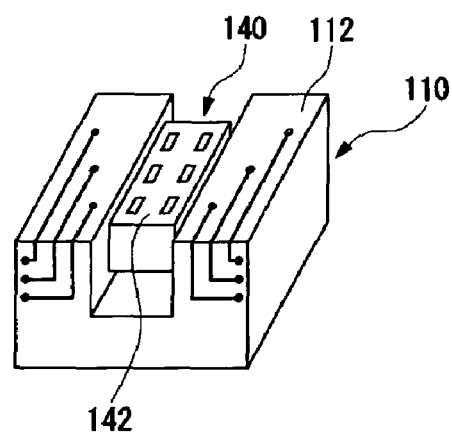

FIG. 5(b) shows a state in which the magnetic detection element 140 is fixed to the groove of the base member 110. The magnetic detection element 140 is formed on a silicon wafer using a semiconductor manufacturing process. The depth of groove in the base member 110 is so formed as to be equal to the height of the magnetic detection element 140. And it is preferable that both the surface 142 of the magnetic detection element 140 and the first surface 112 of the base member 110 have approximately the same height. The magnetic detection element 140 is fixed to the groove of the base member 110 using, for example, adhesives or the like.

Figure 5C:
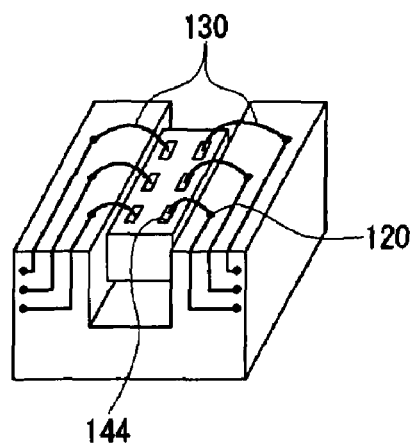

FIG. 5(c) shows a state in which electrodes 144 of the magnetic detection element 140 are connected with first terminals 120 of the base member 110 by wire bonding via thin gold wires 130. Since the electrodes 144 and the first terminals 120 lie on approximately the same plane, the wire boding process can be easily realized. With the above process, the magnetic sensor assembly 100 can be manufactured. When incorporating into a substrate, the magnetic sensor assembly 100 is fixed so that the second surface 114 thereof is substantially parallel to the substrate 102. Thereby, the bonding process for the second terminals 124 can be easily realized.

Figure 6:
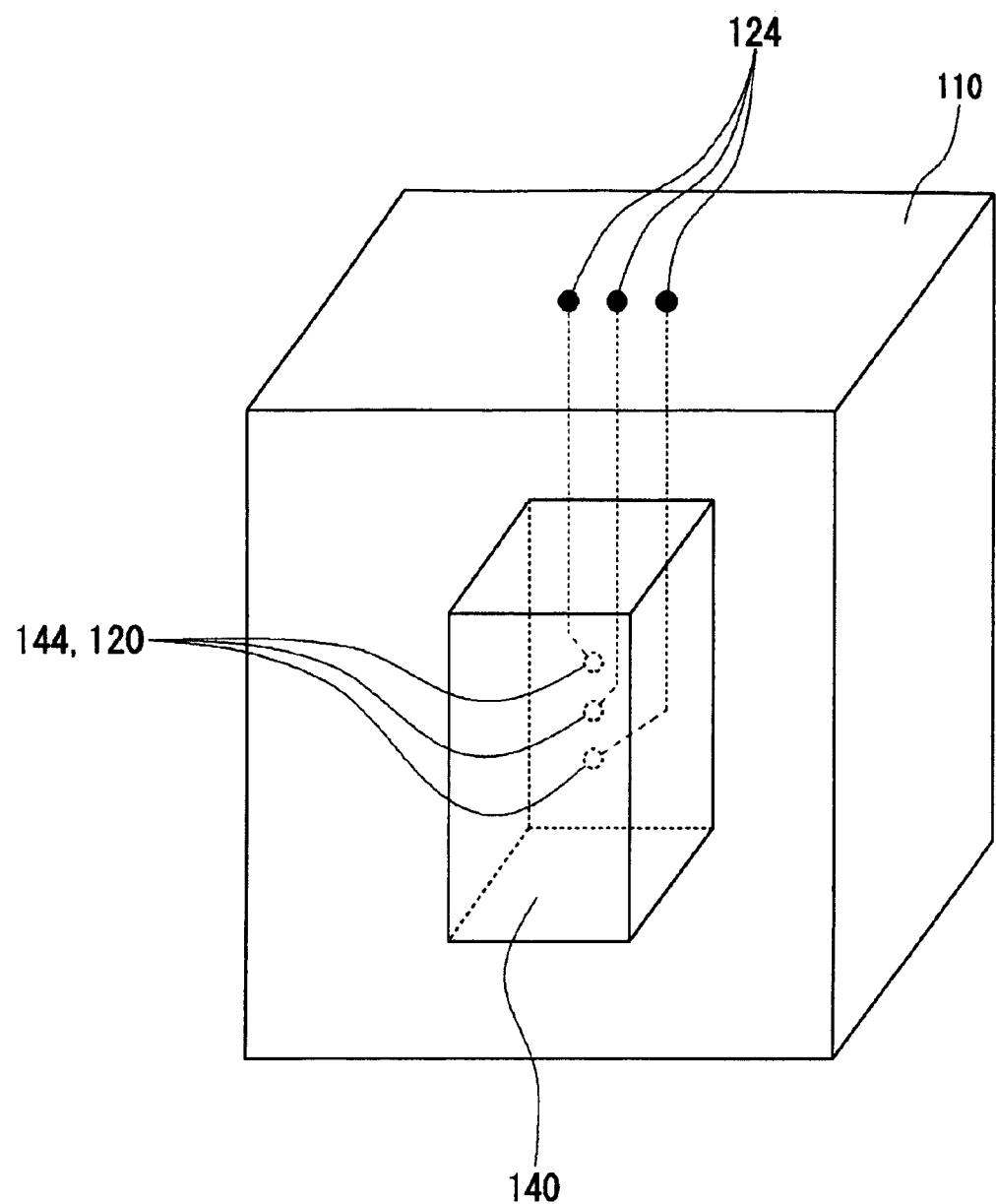
FIG. 6 is a figure showing a modified example for the structure of a magnetic sensor assembly.

FIG. 6 shows a modified example for the structure of the magnetic sensor assembly 100. In this magnetic sensor assembly 100, electrodes 144 of a magnetic detection element 140 are connected with first terminals of a base member 110 by utilizing a wireless bonding process. For example, the electrodes 144 may be connected with the first terminals 120 by the flip-chip method. In this case, a solder bump or Au (gold) bump is formed beforehand on the electrodes 144 of the magnetic detection element 140, and is connected by reflow soldering or the like after this bump for the electrodes 144 and the first terminals 120 are position-adjusted.

Figure 7:
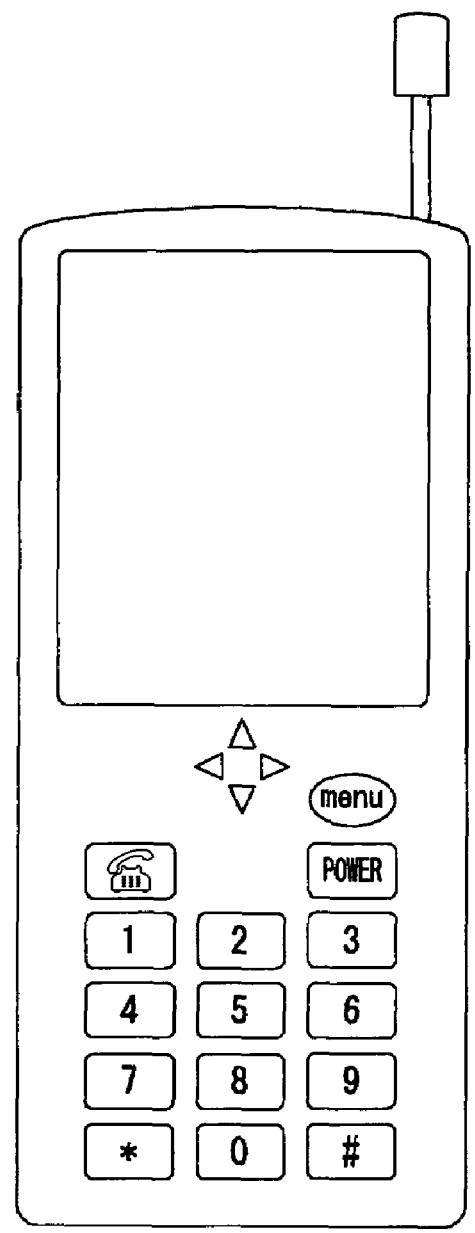
FIG. 7 is a figure showing a cellular phone handset which serves as an example of mobile terminal apparatus.

FIG. 7 shows a cellular phone handset which serves as an example of mobile terminal apparatus. By equipping the cellular phone handset 1 with an azimuth sensor 10 having a magnetic sensor assembly 100 described in the embodiment, the cellular phone handset 1 can have a function of measuring azimuth. The magnetic sensor assembly 100 described in the embodiment contributes to making the azimuth sensor 10 smaller, and is suitable for being introduced to the cellular phone handset 1.

The azimuth sensor 10 allows the extremely high-accuracy measurement of position and azimuth when the map information is delivered onto a mobile terminal apparatus, so that it is also possible to process the map information by the mobile terminal apparatus alone and display it thereon without acquiring positional information from GPS. For example, the cutout of the map information and a display processing may be carried out by installing beforehand application software such as AVA (registered trademark) to the mobile terminal apparatus. Also, though obvious, there may be an arrangement such that the position and azimuth of a mobile terminal apparatus is measured by combining the operation of the azimuth sensor 10 and GPS built inside the mobile terminal apparatus. In any case, it is preferable that the mobile terminal apparatus can display the distributed map information in an enlarged or reduced manner in accordance with the screen size of the apparatus itself.

Moreover, by equipping a mobile terminal apparatus with a barometric detection device 40, the altitude at which the mobile terminal apparatus is located can be measured. Since the measured value of atmospheric pressure varies with the weather, it is preferable that the relationship between the pressures at the earth's surface (absolute atmospheric pressures) and the rises thereof at higher positions above the earth's surface (relative atmospheric pressures) be recorded in advance as a table in a recording unit. It is to be noted that the relationship between the absolute atmospheric pressures and the relative atmospheric pressures may also be stored in the recording unit in the form of a computing equation. The CPU calculates the absolute atmospheric pressure and the relative atmospheric pressure based on the output values of the barometric detection device 40 so as to specify the altitude; moreover, by identifying the present position (latitude and longitude) of a mobile terminal apparatus based on the output values of the magnetic detection device 20, which floor of a building one is located can be determined as a result thereof. If it is judged, for example, that one is situated in the third floor of a building, then information on shops at the third floor can be displayed on the display screen of the mobile terminal apparatus and so forth, so that highly user-friendly mobile terminal apparatus can be realized.

By forming on a single substrate a three-axis magnetic detection device 20, a three-axis tilt detection device 30 and so forth, a highly accurate azimuth sensor 10 can be made much compactly. Although description has been given of this azimuth sensor 10 using an example where it is mostly incorporated into the mobile terminal apparatus, it is easily understood by those skilled in the art that it may also be incorporated into a vehicle or other large-size transfer equipment.

Although the present invention has been described based on embodiments, the technical scope of the present invention is not limited to the scope described in the above-described embodiments. The embodiments are only exemplary and it is understood by those skilled in the art that there may exist other various modifications to the combination of such each component and that such modifications are within the scope of the present invention.

Although, in the present embodiments, description has been given of magnetic sensor assemblies with built-in magnetic detection elements, the present invention can be applied to other element assemblies. In particular, an element, such as a magnetic detection element, where it is difficult to stand upright alone, is structured as an assembly, thereby enabling to eliminate the dragging of the complicated wiring and to make the circuit design easy.

INDUSTRIAL USABILITY

The present invention can be applied, for example, to a field in which elements are mounted.

What is claimed is:

1. A magnetic sensor assembly comprising:
   a magnetic detection element having an electrode on a surface thereof; and
   a base member on which the magnetic detection element is fixed, the base member comprising:
   a first surface provided with a first terminal and a groove, wherein the magnetic detection element is fixed in the groove and the groove is formed to receive the magnetic detection element such that the first surface and the surface of the magnetic detection element having the electrode are substantially parallel and the surface of the magnetic detection element is substantially of the same height as the first surface of the base member when the magnetic detection element is in the groove; and
   a second surface which is disposed at a predetermined angle to the first surface, wherein the second surface is provided with a second terminal electrically connected to the first terminal,
   wherein the electrode of the magnetic detection element is electrically connected with the first terminal by wires.

2. A magnetic sensor assembly according to claim 1, wherein the first surface of the base member is angled substantially perpendicular to the second surface thereof.

3. A mobile terminal apparatus equipped with the magnetic sensor assembly according to claim 1.

4. A terrestrial magnetic detection device in which a plurality of magnetic detection elements each of which detects a terrestrial magnetism vector are provided on a substrate, the terrestrial magnetic detection device characterized in that at least one magnetic detection element includes an electrode on a surface thereof and is fixed to a base member to form a magnetic sensor assembly together with the base member, wherein the base member comprises:
   a first surface provided with a first terminal and a groove, wherein the magnetic detection element is fixed in the groove and the groove is formed to receive the magnetic detection element such that the first surface and the surface of the magnetic detection element having the electrode are substantially parallel and the surface of the magnetic detection element is substantially of the same height as the first surface of the base member when the magnetic detection element is in the groove; and a second surface which is disposed at a predetermined angle to the first surface, wherein the second surface is provided with a second terminal electrically connected to the first terminal, wherein the electrode of the magnetic detection element is electrically connected to the first terminal by wires.

5. A terrestrial magnetic detection device according to claim 4, wherein the magnetic sensor assembly is fixed so that the second surface of the base member is substantially parallel to the substrate.

6. An element assembly comprising:
an element having an electrode on a surface thereof; and
a base member on which the element is fixed, the base member comprising:

a first surface provided with a first terminal and a groove, wherein the element is fixed in the groove and the groove is formed to receive the element such that the first surface and the surface of the element having the electrode are substantially parallel and the surface of the magnetic detection element is substantially of the same height as the first surface of the base member when the magnetic detection element is in the groove; and a second surface which is disposed at a predetermined angle to the first surface, wherein the second surface is provided with a second terminal electrically connected to the first terminal, wherein the electrode of the element is electrically connected to the first terminal by wires.

* * * * *